(12) United States Patent
Anderson et al.

(10) Patent No.: US 12,482,746 B2
(45) Date of Patent: Nov. 25, 2025

(54) EARLY BACKSIDE FIRST POWER DELIVERY NETWORK

(71) Applicant: International Business Machines Corporation, Armonk, NY (US)

(72) Inventors: Brent Anderson, Jericho, VT (US); Lawrence A. Clevenger, Saratoga Springs, NY (US); Christopher J. Penny, Saratoga Springs, NY (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 835 days.

(21) Appl. No.: 17/508,113

(22) Filed: Oct. 22, 2021

(65) Prior Publication Data
US 2023/0128985 A1    Apr. 27, 2023

(51) Int. Cl.
*H01L 23/528* (2006.01)
*H10D 86/00* (2025.01)
*H01L 25/065* (2023.01)

(52) U.S. Cl.
CPC ......... *H01L 23/528* (2013.01); *H10D 86/201* (2025.01); *H01L 25/0657* (2013.01)

(58) Field of Classification Search
CPC .. H01L 23/528; H01L 25/0657; H10D 86/201
See application file for complete search history.

(56) References Cited

U.S. PATENT DOCUMENTS

| | | | |
|---|---|---|---|
| 7,514,292 B2 | 4/2009 | Etland et al. | |
| 7,863,654 B2 | 1/2011 | Lin | |
| 8,859,416 B2 * | 10/2014 | Doman | H10D 89/10 |
| | | | 716/55 |
| 9,379,059 B2 | 6/2016 | Ko et al. | |
| 10,636,739 B2 | 4/2020 | Beyne et al. | |

(Continued)

FOREIGN PATENT DOCUMENTS

| | | | |
|---|---|---|---|
| CN | 116344449 A | * | 6/2023 |
| CN | 119252743 A | * | 1/2025 |

(Continued)

OTHER PUBLICATIONS

International Search Report dated Jan. 19, 2023 received in PCT/EP2022/078617, 15 pages.

*Primary Examiner* — Laura M Menz
(74) *Attorney, Agent, or Firm* — Scully, Scott, Murphy & Presser, P.C.; Yuanmin Cai

(57) ABSTRACT

A semiconductor structure and method of manufacturing a semiconductor structure having a front side and an opposing backside. An early power delivery network (EBPDN) of wires is built above a substrate layer. Buried power rails (BPRs) are built above levels of the PDN and connected to the EBPDN by short length via connections that can be self-aligned to the back side buried power rails. Both BPRs and vias connections have a common metallization. A front side level of transistor devices are built at the front side of the structure above the BPRs. The resulting formed buried power rail structure has an aspect ratio of height:width greater than 4:1, a height >3 times a height of the formed via structure; and a via structure having a length greater than a height of the formed conductive power rail structure.

10 Claims, 5 Drawing Sheets

(56) References Cited

U.S. PATENT DOCUMENTS

| | | | |
|---|---|---|---|
| 10,985,103 B2 | 4/2021 | Hong et al. | |
| 11,158,580 B2* | 10/2021 | Sio | H01L 21/4857 |
| 11,735,525 B2* | 8/2023 | Liebmann | H01L 21/76877 |
| | | | 257/691 |
| 11,756,887 B2* | 9/2023 | Lanzillo | H01L 23/535 |
| | | | 257/734 |
| 11,881,455 B2* | 1/2024 | Park | H01L 23/5286 |
| 11,901,294 B2* | 2/2024 | Vadi | H01L 23/5286 |
| 12,046,643 B2* | 7/2024 | Frougier | H10D 86/201 |
| 12,051,692 B2* | 7/2024 | Shi | H01L 23/5286 |
| 12,057,371 B2* | 8/2024 | Xie | H01L 23/535 |
| 12,125,788 B2* | 10/2024 | Park | H01L 21/76898 |
| 12,230,571 B2* | 2/2025 | Son | H01L 23/535 |
| 2013/0280905 A1* | 10/2013 | Doman | H10D 89/10 |
| | | | 438/618 |
| 2018/0033729 A1 | 2/2018 | Xu et al. | |
| 2018/0240797 A1* | 8/2018 | Yokoyama | H10D 84/0149 |
| 2019/0123140 A1 | 4/2019 | Park et al. | |
| 2019/0237461 A1* | 8/2019 | Or-Bach | H10D 86/01 |
| 2020/0035560 A1* | 1/2020 | Block | H10D 84/0186 |
| 2020/0075489 A1 | 3/2020 | Liebmann et al. | |
| 2020/0266169 A1* | 8/2020 | Kang | H10D 84/0149 |
| 2020/0365509 A1 | 11/2020 | Sasaki et al. | |
| 2020/0373242 A1 | 11/2020 | Hiblot et al. | |
| 2021/0118798 A1* | 4/2021 | Liebmann | H01L 21/76895 |
| 2021/0118805 A1* | 4/2021 | Sio | H01L 24/19 |
| 2021/0134721 A1 | 5/2021 | Chiang et al. | |
| 2021/0280585 A1* | 9/2021 | Jin | H10D 30/6211 |
| 2022/0301981 A1* | 9/2022 | Chang | H01L 23/481 |
| 2022/0367461 A1* | 11/2022 | Chanemougame | H10D 84/0167 |
| 2023/0086420 A1* | 3/2023 | Chen | H01L 21/76885 |
| | | | 257/773 |
| 2023/0128985 A1* | 4/2023 | Anderson | H01L 23/528 |
| | | | 257/132 |
| 2023/0132353 A1* | 4/2023 | Xie | H01L 23/535 |
| | | | 257/288 |
| 2023/0163073 A1* | 5/2023 | Son | H01L 23/535 |
| | | | 257/213 |
| 2023/0275021 A1* | 8/2023 | Hong | H01L 23/5226 |
| 2023/0369218 A1* | 11/2023 | Li | H10D 30/6757 |
| 2023/0377983 A1* | 11/2023 | Smith | H10D 88/00 |
| 2023/0377985 A1* | 11/2023 | Smith | H10D 84/83 |
| 2023/0377998 A1* | 11/2023 | Smith | H01L 23/5286 |
| 2023/0378138 A1* | 11/2023 | Smith | H10D 30/6757 |
| 2023/0378170 A1* | 11/2023 | Smith | H10D 84/038 |
| 2023/0411290 A1* | 12/2023 | Xie | H10D 30/6757 |
| 2024/0071926 A1* | 2/2024 | Li | H10D 84/856 |
| 2024/0072133 A1* | 2/2024 | Xie | H10D 64/017 |
| 2024/0088015 A1* | 3/2024 | Kim | H01L 23/5223 |
| 2024/0105608 A1* | 3/2024 | Lanzillo | H10D 84/038 |
| 2024/0105612 A1* | 3/2024 | Xie | H10D 88/101 |
| 2024/0136287 A1* | 4/2024 | Xie | H10D 84/0149 |
| 2024/0136290 A1* | 4/2024 | Kim | H01L 23/481 |
| 2024/0203994 A1* | 6/2024 | Gupta | H01L 23/535 |
| 2024/0222229 A1* | 7/2024 | Li | H01L 23/481 |
| 2024/0234316 A9* | 7/2024 | Xie | H10D 84/0149 |
| 2024/0234319 A9* | 7/2024 | Kim | H01L 21/76895 |
| 2024/0258176 A1* | 8/2024 | Kim | H10D 84/0149 |
| 2024/0266288 A1* | 8/2024 | Kim | H10D 30/6729 |
| 2024/0332183 A1* | 10/2024 | Katkar | H01L 23/535 |
| 2024/0339498 A1* | 10/2024 | Yoo | H10D 84/017 |
| 2024/0421003 A1* | 12/2024 | Kang | H01L 21/76897 |
| 2025/0046756 A1* | 2/2025 | Hsiao | H01L 23/3121 |
| 2025/0048677 A1* | 2/2025 | Li | H10D 62/121 |

FOREIGN PATENT DOCUMENTS

| | | | | |
|---|---|---|---|---|
| EP | 3671859 A1 | | 6/2020 | |
| EP | 3324436 B1 | | 8/2020 | |
| EP | 3742487 A1 | | 11/2020 | |
| EP | 3651188 B1 | | 5/2021 | |
| EP | 4420163 A1 | | 8/2024 | |
| GB | 2625965 A | * | 7/2024 | H01L 21/743 |
| JP | 2023063252 A | * | 5/2023 | H01L 23/528 |
| JP | 2023064745 A | * | 5/2023 | H01L 21/743 |
| KR | 102798340 B1 | * | 4/2025 | H01L 23/5286 |
| WO | WO-2023041994 A1 | * | 3/2023 | H01L 21/743 |
| WO | WO-2023066797 A1 | * | 4/2023 | H01L 23/528 |
| WO | WO-2023072529 A1 | * | 5/2023 | H01L 21/743 |

* cited by examiner

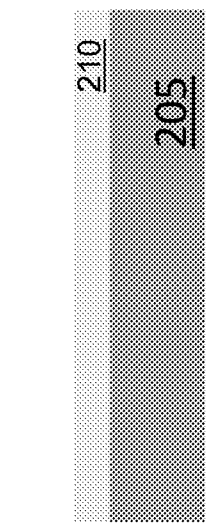
FIG. 2A
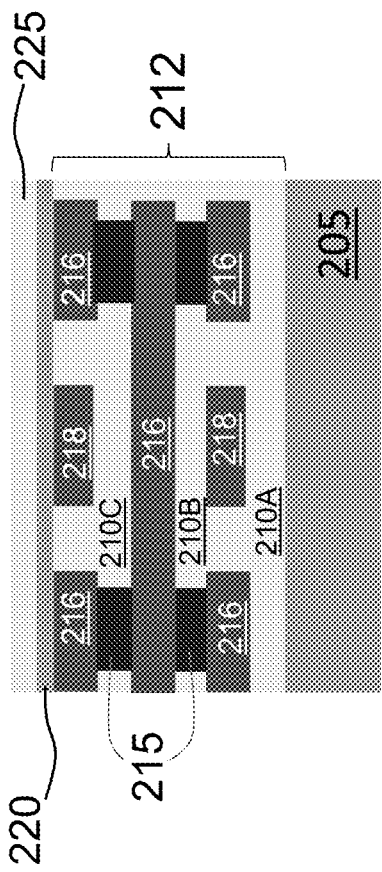
FIG. 2B
FIG. 2C

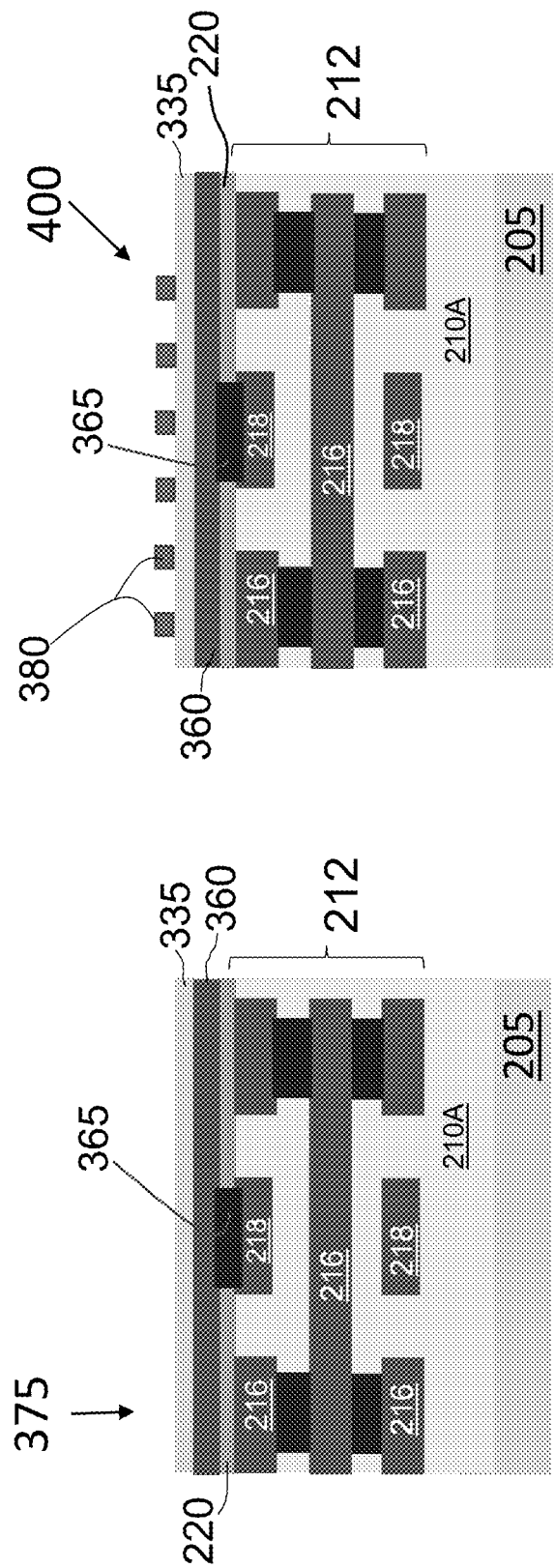

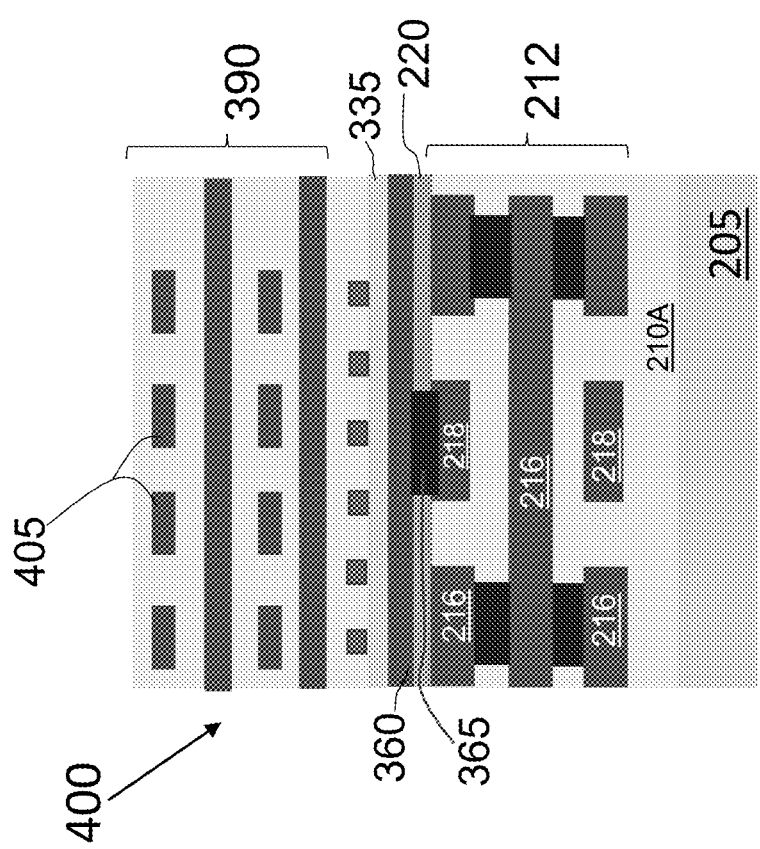

EARLY BACKSIDE FIRST POWER DELIVERY NETWORK

BACKGROUND

The present application generally relates to integrated circuits, and particularly to semiconductor chips and integrated circuits and methods and architectures for supplying power to integrated circuits including VLSI chip modules/packages.

A back-side Power Delivery Network and Buried power rails (BPR) at the device level are provided in semiconductor integrated circuits to free up routing space and reduce cell height and particularly allowing space for front-side power delivery networks (PDNs), e.g., above the active device layer. Typically, a vertical through-silicon via (TSV) or through-chip via is used to provide electrical connection between the back-side power delivery network and the buried power rails.

One prior art design provides both a backside (i.e., meaning back of the transistor) power delivery network and buried power rail conductors at the device level to free up front-side routing space and reduce cell height. In such a design, the Buried power rails are built during the forming of the device layers, however, require further processes that including a flipping of the wafer, a later forming of the buried power delivery network and high-aspect ratio, tight-pitch through silicon vias (μTSV) that connect the later formed power delivery network to the buried power rails. The forming of high-aspect ratio, tight-pitched μTSVs present alignment issues and other processing issues.

SUMMARY

Aspects of the disclosure provide a semiconductor integrated circuit device or structure that includes backside power delivery and a method of its manufacture.

The semiconductor IC device includes an early backside power delivery wiring network (EBPDN) built early on a substrate and then a semiconductor layer for transistors and other semiconductor devices is added.

The semiconductor IC device further includes at least buried power rails (BPRs) above the early backside power delivery networks (EBPDNs) with efficient connection which is at or below the level of transistors and other semiconductor devices at the front side.

The BPR connects to the EBPDN wiring using short (i.e., reduced aspect ratio) via connections, built using damascene/dual damascene processes with enabled by provision of a highly selective etch-stop layer.

In an aspect, the BPR is self-aligned to the EBPDN wiring using the damascene via connection and the BPR and via have a common metallization.

In one aspect, there is provided a semiconductor structure. The semiconductor structure comprises: a substrate; a first insulating material layer above the substrate; a plurality of conductive metal wires disposed within the first insulating material layer and forming a power delivery network above the substrate of the semiconductor structure; a plurality of conductive power rail structures disposed above the plurality of conductive metal wires and separated therefrom by an etch stop dielectric material layer; and a conductive via structure electrically connecting a conductive power rail structure to a conductive power wire, the conductive via passing through the etch stop dielectric material layer.

In a further aspect, there is provided a semiconductor structure. The semiconductor structure comprises: a first semiconductor structure having a substrate; a first insulating material layer above the substrate; a plurality of conductive metal wires disposed within the first insulating material layer and forming a power delivery network above the substrate of the semiconductor structure; an etch-stop dielectric material layer formed above the first insulating material layer; a second insulating material layer formed atop the etch stop dielectric material layer; a plurality of conductive power rail structures disposed within the second insulating material layer, a respective corresponding conductive power rail structure formed above a respective conductive metal wire; and a conductive via structure electrically connecting the respective conductive power rail structure to its respective corresponding conductive power wire, the conductive via passing through the etch-stop dielectric material layer.

The present application provides a method of forming a conductive structure in a backside of an integrated circuit (IC). The method comprises: providing a first structure having a semiconductor substrate: forming above the semiconductor substrate, one or more first layers of insulating material, and forming within each one or more first layers of insulating material, a plurality of conductive metal wires, said plurality of conductive metal wires forming part of a power delivery network, said plurality of conductive metal wires at a topmost first insulating material layer having a top surface co-planar with a top surface of said topmost insulating material layer; forming a second insulating material layer above the top surface of said topmost insulating material layer, the second insulating material layer comprising an etch stop layer above the co-planar top surfaces of said plurality of conductive metal wires and topmost insulating material layer; patterning and etching a buried power rail trench terminating at the etch stop layer; patterning and etching a via opening through the etch stop layer, said via opening corresponding to and exposing said top surface of said conductive metal wires at the topmost insulating material layer; and filling said buried power rail trench and via opening with a common metal material to form respective conductive power rail and via structures

BRIEF DESCRIPTION OF THE SEVERAL VIEWS OF THE DRAWINGS

FIGS. 2A-2C depict method steps for forming a portion of the semiconductor structure depicted in FIGS. 1A, 1B on a first semiconductor wafer including the forming of an early back-side power delivery network (EBPDN) for scaling enablement in the embodiments of FIGS. 1A,1B; and FIGS. 3A-3E depict remaining method steps for forming a remaining portion of the semiconductor structure depicted in FIGS. 1A, 1B that includes a bonding of a second wafer structure to the first wafter structure shown in FIG. 2C and the employing further manufacturing steps for forming of the buried power rails (BPR) for scaling enablement in the embodiments of FIGS. 1A,1B.

DETAILED DESCRIPTION

Figures 1A, 1B:
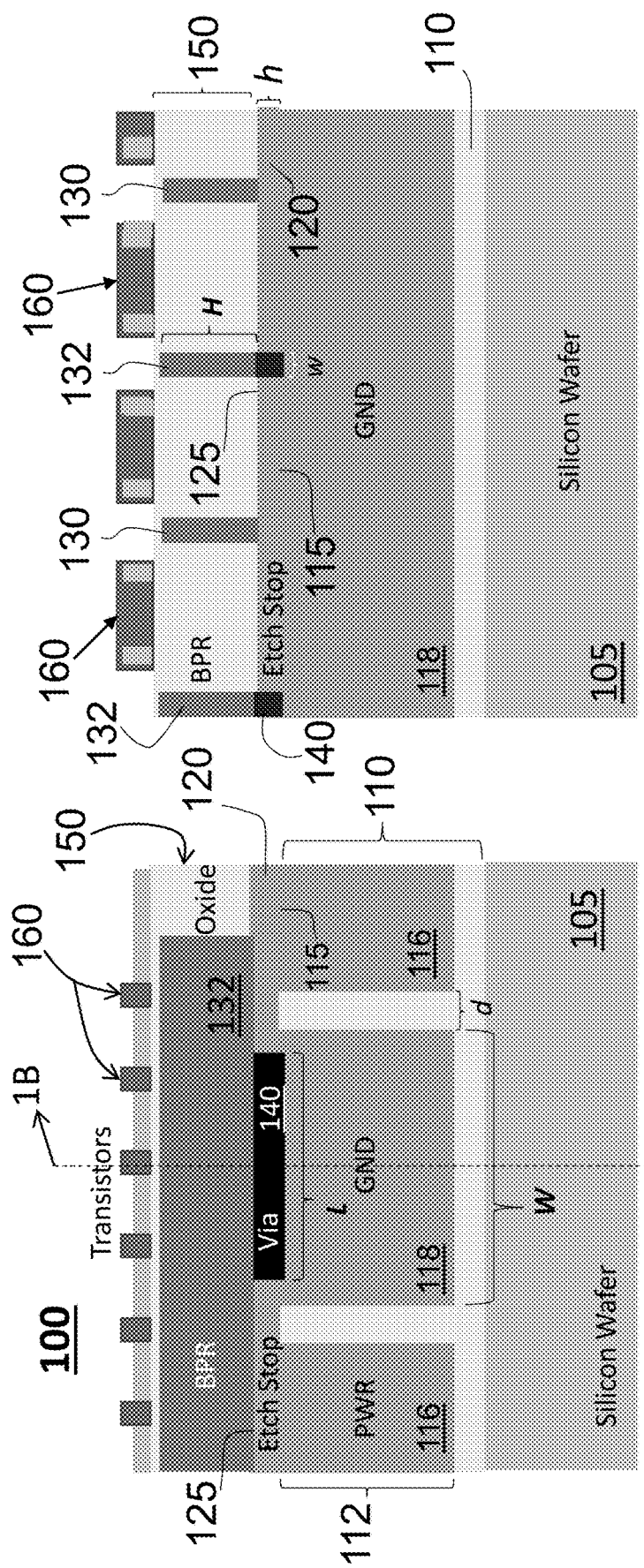
FIGS. 1A and 1B depict corresponding cross-sectional views of a resulting VLSI semiconductor structure employing buried power rails (BPR) and early back-side power delivery network (EBPDN) for scaling enablement according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present disclosure discloses a semiconductor integrated circuit (IC) structure and method of fabrication and operation.

FIGS. 1A and 1B depict corresponding cross-sectional views of a portion of a VLSI semiconductor wafer 100 employing buried power rails (BPR) and an early back-side power delivery network (EBPDN) for scaling enablement. As shown in FIGS. 1A, 1B, wafer 100 includes a substrate 105 and one or more dielectric layers 110, e.g., an oxide having an EBPDN 112 formed therein. The EBPDN 112 is formed "early" in the process, e.g., using typical back-end-of-line semiconductor manufacturing processing. EBPDN 112 includes power tap cells such as power cells 116 of metal material, e.g., for carrying supply voltages, and ground cells 118 formed in the dielectric layer 110. Though one level of a EBPDN 112 is depicted in FIGS. 1A, 1B, there can be multiple dielectric layers formed with each layer having multiple power cells 116 and ground cells 118 of metal material formed as separate wiring networks therein. Possible metal materials for EBPDN wiring can include W, Co, Ru, Cu, Al. As shown in FIGS. 1A and 1B, each power cell 116 and ground cell 118 connect to a respective overlying buried power rail (BPR) 130, 132 of metal material using a via connection 140. An optional etch stop layer 120 is shown overlying a surface 115 of an uppermost dielectric layer and power cells 116 and ground cells 118. Overlying a surface 125 of the etch stop layer 120 is a further upper dielectric layer 150 (e.g., an oxide) within which is formed the buried power rails 130, 132 and overlying active device layer including transistors 160. In an embodiment, a first wafer is constructed including the dielectric layer 110, EBPDN 112 and overlying etch stop layer, and a second wafer is bonded to a surface of the first wafer, the second wafer being bonded at a dielectric layer 150 within which is formed the buried power rails 130, 132 and overlying active devices, e.g., transistors 160. In an embodiment, a bottom of a BPR is aligned to the etch stop layer 120. As shown in FIGS. 1A, 1B, through the etch stop layer 120 are the via connections 140 formed to connect the power cell 116 and ground cell 118 to a respective buried power rail 130, 132. In an embodiment, a damascene process is performed to construct a via 140 that is self-aligned to a buried power rail. Alternatively, a dual damascene process forms the BPR 130, 132 and corresponding via connecting to the Early Backside Power wiring network 112 such that the BPR 130, 132 and via 140 have a common metallization. Possible metal materials for BPR 130, 132 wiring can include W, Co, Ru, Cu, Al.

Above or within the upper dielectric layer 150 of the bonded second wafer is formed a variety of other devices, e.g., transistors 160, resistors, isolation structures, contacts, and/or diodes, etc., some of which connect through metal wiring (not shown) to power supply and/or ground connections of the buried power rails 130, 132. In an embodiment, the cross-sectional view of FIG. 1A is taken at a cross-section perpendicular to a gate of a transistor 160, while FIG. 1B is taken at a cross-section parallel to a gate of the transistor 160.

In the cross-sectional view of the semiconductor structures 100 shown in FIGS. 1A, 1B the formed BPR 130, 132 are dimensioned such that a BPR height "H" to width "w" aspect ratio is greater than about 4:1 (>4:1). Further, the structure of a formed BPR 130, 132 is dimensioned such that the height "H" of the BPR 130, 132 is greater than three times (>3×) a height "h" of its connecting via 140. In an embodiment, a length "L" of an individual via 140 is greater than (>) a height "H" of a BPR 130, 132. Further, in an embodiment, a length "L" of an individual via 140 is greater than 50 percent (>50%) of a width "W" of the EBPDN power wiring, e.g., ground cell 118. Further, in an embodiment, a ratio of a length "L" of an individual via 140 via to width "w" of an individual via 140 is greater than 3:1 (>3:1). Further, in an embodiment, the early backside power wiring defining power cell 116 and ground cell 118 can have optional etched sidewalls. Further, in an embodiment, a ratio of a width "W" of the early backside power wiring width to a width "d" of spacing between adjacent early backside power wiring cells, e.g., power cell 116 and ground cell 118, is greater than 1.5:1 (>1.5:1).

FIGS. 2A-2C depict method steps 200 for forming a portion of the semiconductor structure depicted in FIGS. 1A, 1B on a first VLSI semiconductor wafer including the forming an early back-side power delivery network (EBPDN) for scaling enablement in the embodiments of FIGS. 1A, 1B. The method steps of FIGS. 2A-2C includes the "early" FEOL process to first build the Early Backside Power Delivery wiring network prior to bonding of a second wafer including a device layer.

As shown in FIG. 2A, initially, there is provided a semiconductor substrate 205 of a first semiconductor wafer, e.g., at a front-end-of-the-line (FEOL) level. Semiconductor substrate 205 includes a bulk semiconductor substrate that may include a semiconductor material or a stack of semiconductor materials such as, for example, Si, Ge, SiGe, SiC, SiGeC, Ge alloys, GaAs, InAs, InP as well as other III/V or II/VI compound semiconductors. In one embodiment, the bulk semiconductor substrate includes a single crystalline semiconductor material such as, for example, single crystalline silicon. The thickness of the bulk semiconductor substrate can be from 30 μm to about 2 mm, although lesser and greater thicknesses can also be employed. The bulk semiconductor substrate may be doped with dopants of p-type or n-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The dopant concentration in the bulk semiconductor substrate can range from $1\times10^{14}$ atoms/cm$^3$ to $3\times10^{17}$ atoms/cm$^3$.

Alternatively, a semiconductor-on-insulator substrate can be used in place of the bulk semiconductor substrate shown in FIG. 2A.

As shown in FIG. 2A (and FIG. 2B), after providing the semiconductor substrate 205 as described above, one or more dielectric material layers 210 (e.g., 210A, 210B, 210C) are formed on the surface of the semiconductor substrate.

The dielectric material layer(s) 210 can be composed of a dielectric material such as, for example, silicon dioxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0; all dielectric constants are measured under vacuum unless otherwise stated herein). In another embodiment, a self-planarizing material such as a spin-on glass (SOG) or a spin-on low-k dielectric material such as SiLK™ can be used as the dielectric material for the dielectric material layers 210.

Each dielectric material layer 210A, 210B, 210C can be formed utilizing a deposition process including, for example, chemical vapor deposition (CVD), plasma enhanced chemical vapor deposition (PECVD), evaporation or spin-on coating. Each dielectric material layer 210 can have a thickness from 10 nm to 2000 nm. In some embodiments, each dielectric material layer has a same thickness. In other embodiments, at least one of the dielectric material layers has a different thickness than a thickness of another of the interlayer dielectric material layers of material stack 11.

As shown in FIG. 2B, at each successive layer or level 210A, 210B, 210C, one or more conductors or metal lines forming power cells 216 and ground cells 218 of the EBPDN 212 are formed. The early backside power delivery wiring conductors or metal lines 216, 218 may be formed by a damascene process where the dielectric layer is etched to form trenches and then filled with metal, or may be formed using a subtractive metal etch process where a metal is deposited and then etched to form metal lines and then backfilling the open trenches with a dielectric. As shown in FIG. 2B, in an embodiment, a ratio of the width "W" of the early backside power delivery network wiring cells 216, 218 to a width "d" of the spacing between adjacent EBPDN wiring cells, e.g., power cell 216 and ground cell 218, is greater than 1.5:1 (>1.5:1).

In an embodiment, using a damascene technique, the dielectric layer 210A may be etched to form trenches or openings using, for example, lithographic mask and etch techniques. A conductive material is deposited to fill the openings. For example, a conductive material including a metal such as Cu, W, Co, Ru, Al or alloys thereof may be formed to fill the openings. The conductive material may be formed by, for example, plating, such as electro or electroless plating. Other types of conductive layers or forming techniques may also be useful. The thickness of an EBPDN power delivery wiring or cell 216, 218 may range from between 20 nm to 2000 nm. Excess conductive materials are removed by, for example, by chemical-mechanical polishing (CMP), leaving a planar surface with the conductive line and the dielectric layer 210A. Additional layers of dielectric material and embedded conductors or metal lines forming power cells 216 and ground cells 218 of the EBPDN 212 can be additionally formed on top layer 210A. For example, a further dielectric layer (e.g., oxide) 210B may be deposited using CVD, PECVD, evaporation or spin-on coating, etc. and semiconductor lithographic process used to deposit a further level of conductive lines and vias.

In further processing steps, one or more openings can be formed in the dielectric layer 210B to form metal via contacts 215 that contact conductive power cell lines 216, 218 formed in the underlying layer using a conventional subtractive etch or damascene process. In an embodiment, both the lines and vias can be formed by damascene or subtractive etch process, however they do not need to be tied directly to the same process, e.g., the lines may be formed by subtractive etch or damascene and the vias can be made using damascene or subtractive etch processes. Having a line formed as subtractive does not limit the method to form the via. For example, a patterned resist mask with openings corresponding to the vias is formed over the dielectric layer. An anisotropic etch, such as RIE, is performed to form the vias, exposing the top surfaces of the power cells 216, 218 formed of the underlying layer. A conductive material, such as Cu, W, Co, Ru, Al or alloys thereof is then deposited on the substrate, filling the openings. This conductive via may be formed by sputtering. A planarization process, such as chemical mechanical planarization (CMP), may then be performed to remove excess conductive material, leaving these contact vias 215 in the next level 210B of that planar surface. Then further conductive lines forming power cells 216 and ground cells 218 of the EBPDN 212 are formed thereon to contact respective vias 215 forming part of the power delivery network. In an embodiment, the conductive lines 216 of layer 210A connect with like conductive lines 216 of layer 210B, and likewise, conductive lines 218 of layer 210A connect with like conductive lines 218 of layer 210B. In embodiments, each formed conducting power wires 216, 218 is formed to include a width dimension "W" (as shown in FIG. 1A.

Alternatively, the power delivery network layer(s) of conductive lines and vias can be formed using a dual damascene process as known in the art to create both metal vias 215 and further conductive lines 216, 218 at the next layer 210B to electrically connect with the like respective lines 216, 218 at the lower layer. After CMP and further deposition of dielectric layer 210C, similar dual damascene processes can be used to form the conductive lines 216 of layer 210C to connect with like conductive lines 216 of layer 210B through a formed via contact 215 and likewise form conductive lines 218 of layer 210C that electrically connect with like conductive lines 218 of layer 210B through a formed via contacts (not shown). The dual damascene processes may include creating respective vias and lines by etching holes and trenches in the dielectric, and then depositing the metal material in both features. For example, a first photolithography/etch step to make holes (vias) in the dielectric layer are performed to make connection with underlying metal, and a further photo/etch step to make trenches for the metal line are performed. These two photo/etch steps can be performed to first form the trench feature for the EBPDN metal line and then forming the via 215, or alternately, first form the via 215, and then forming the trench for the EBPDN metal lines.

A final CMP step is then performed to planarize the surface of the top dielectric layer and the metal lines forming EBPDN power cells 216 and ground cells 218.

As shown in FIG. 2C, after the final CMP step, an etch stop layer 220 is formed on the surface utilizing a deposition process including, for example, CVD, PECVD, ALD, PVD, sputtering, chemical solution deposition or plating. The etch-stop layer 220 is composed of a known etch-stop material including certain metals, silicon dioxide ($SiO_2$) or silicon nitride ($Si_3N_4$) and may have a thickness ranging from 2 nm to 25 nm although other thicknesses are possible.

Finally, a dielectric layer 225 is formed above the planarized etch-stop layer 220 by a CVD, PECVD or ALD process to form an intermediate power delivery semiconductor device structure 250. In one embodiment, the top dielectric layer 225 can comprise silicon oxide, silicon oxynitride, or silicon nitride and may have a thickness ranging from 15 nm to 100 nm although other thicknesses that are lesser than 15 nm, or greater 100 nm may also be employed as the thickness of the dielectric layer 225. An optional CMP planarizing step may be performed to smooth the top surface 252 of the final intermediate power delivery semiconductor device structure 250 of the first wafer.

FIGS. 3A-3E depict remaining method steps for forming a remaining portion of the semiconductor structure depicted in FIGS. 1A, 1B that includes a bonding of a second wafer structure to the first wafer structure shown in FIG. 2C and the employing further manufacturing steps for forming of the buried power rails (BPR) for scaling enablement in the embodiments of FIGS. 1A, 1B.

Figures 3A, 3B:
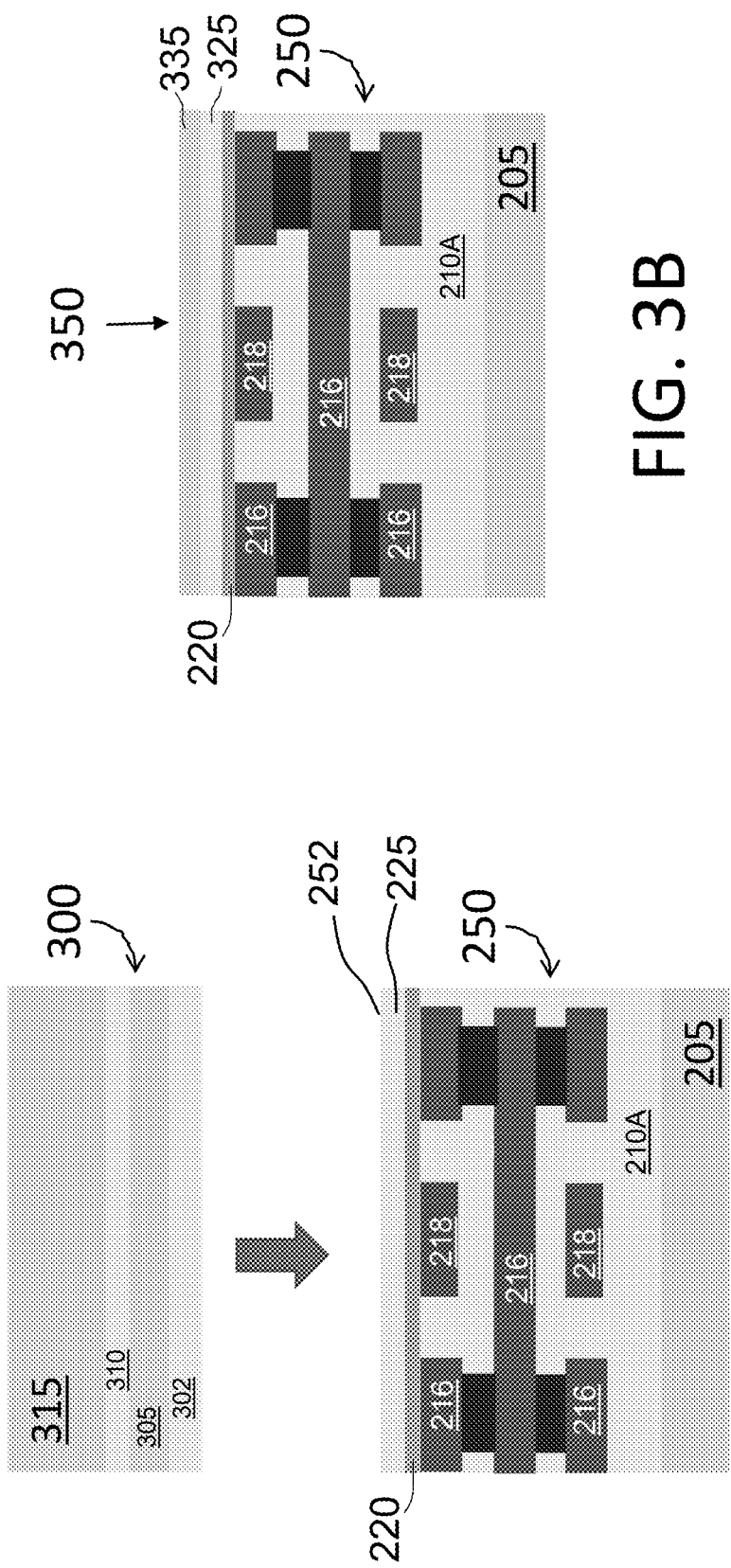

Continuing to FIG. 3A, a second wafer 300 is bonded to the top surface 252 of the intermediate power delivery semiconductor device structure 250. In an embodiment, the second wafer is first formed as a Silicon-on-insulator wafer structure 300 to include a top dielectric material layer 302 (e.g., an oxide layer) formed over a Silicon semiconductor material layer 305, a buried oxide layer (BOX) 310 formed over a bottom Si substrate 315. This second wafer is flipped and the top dielectric material layer 302 is bonded to the top dielectric material layer surface 252 of the first wafer. In a non-limiting embodiment, the wafer bonding process employs the known Smart Tec™ process (Trademark of Soitec USA, Inc.) as described at https://www.soitec.com/en/products/smart-cut to bond the dielectric layers of the two wafers.

Then, as shown in FIG. 3B, after the bonding process, further steps are performed to remove the top substrate layer 315 and remove the underlying BOX layer 310. A further CMP process is performed to thin the remaining silicon layer to a desired thickness ranging from between 25 nm to 500 nm. Thus, the resulting structure 350 shown in FIG. 3B includes a thinned top Si material layer 335 overlying the bonded dielectric material layer 325.

FIG. 3C shows the resulting structure 375 after additional process steps for forming a buried power rail conductor 360 and corresponding conductive via 365 that connects the buried power rail conductor 360 to a power wire of the EBPDN 212. In an embodiment, there are two options to open the etch stop layer. One option is to open the etch stop layer after the deposition of the etch stop layer 220. Although this would obviate the self-alignment to the buried power rail, it can be performed at larger dimensions since the material is being directly patterned. A second option is to pattern the etch stop after the buried power rail etch such that the via is a self-aligned to the buried power rail. In this second option, the process includes first using lithography to pattern trench features for forming the buried power rail conductor and then performing an anisotropic etch to form the buried power rail trench feature down to the etch stop layer 220. In an embodiment, the patterning and etching of the formed BPR trench is such that the resulting formed BPR conductor has a height:width (H:w) aspect ratio greater than about 4:1, i.e., the height of BPR conductor relative to its width is >4:1.

Then, there is further performed a second patterning and anisotropic etching to form a via opening (not shown) through the etch-stop layer 220 that is self-aligned to the buried power rail trench feature (unless prior etch stop is opened). This second self-aligned via etch exposes a surface of the underlying to form a self-aligned via contact to connect the buried power rail to the underlying power wire of the EBPDN 212. In an embodiment, the patterning and etching of the formed via opening (or prior formed etch stop opening) is such that its height h corresponds to the thickness of the etch stop layer 220, and the resulting formed BPR conductor is of a height H greater than three times (>3×) the height "h" of the connecting via. Further, in an embodiment, the patterning and etching of the formed via opening (or prior formed etch stop opening) is such that the resulting formed via is dimensioned to have a length L greater than (>) the height "H" of its connecting BPR. Further, in an embodiment, the patterning and etching of the formed BPR trench and via opening is such that the resulting formed connecting via has a length "L" greater than 50 percent (>50%) of the width "W" of the underlying connected EBPDN power cell wiring. Further, in an embodiment, the patterning and etching of the formed via opening (or prior formed etch stop opening) is such that a L:w ratio (i.e., ratio of a length "L" of the resulting formed via to width "w" of the via) is greater than 3:1 (>3:1).

Then, the resulting structure including the BP-BPR trenches having the H dimension and corresponding via openings of the L, w, h dimensions is subject to a deposition process to metalize both the BPR conductor rail and the conductive via with a common electrically conductive metallization material such as W, Co, Ru, Cu, Al, etc. to form the BPR conductor 360 and corresponding via 365. In an embodiment, this metal fill material can be formed by a deposition process such as, for example, sputtering, electroplating, electroless plating, ALD, CVD, PECVD or PVD. After the common metallization process, the resulting structure 375 of FIG. 3C shows the BPR conductor 360 connecting the ground power cell 218 of the underlying EBPDN 212 through the connecting via 365. As the present disclosure is not limited to a single line buried power rail, it is understood that, additional buried power rail conductors 365 are formed, with a respective buried power rail conductor connecting to a respective underlying power cell wiring 216, 218 of the underlying EBPDN 212 through a respective connecting via 365.

Continuing to FIG. 3D, additional semiconductor processes are implemented to form transistors 380 or other circuit devices (switches, resistors, isolation structures, contacts, diodes, etc.). With respect to forming the transistors 380, middle-of-line (MOL) and/or back-end-of-line (BEOL) semiconductor manufacturing processes at a "front" side 400 of the structure connect Source/Drain regions to the suitable BPR conductor 360 that connect to either power cell wiring 216 or wiring 218 of the underlying EBPDN 212 as an integrated circuit being manufactured requires. Such processes include the forming of one or more interlevel dielectric layers and corresponding embedded metal wire levels and interconnects (not shown) to ensure device connections to the suitable BPR conductor 360 that connect to either power cell wiring 216 or wiring 218 of the underlying EBPDN as the circuit requires.

Finally, FIG. 3E shows a structure resulting from additional process steps to form C4 connections on the front side 400 of the device of FIG. 3D. That is, additional C4 bumps and interconnection wiring 405 can be formed on top of the structure for C4 wire soldering.

The advantages of the early process for building the power delivery network first and then bonding of the device layer above reduces cost of yield issues with EBPDN process (e.g., scrap low cost wafer); significantly simplified process flow as compared to later process flows; and the provision of the etch stop layer that improves manufacturability and performance.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a substrate;
    a first insulating material layer above the substrate;
    a plurality of conductive metal wires disposed within said first insulating material layer and forming a power delivery network (PDN) above the substrate of said semiconductor structure;
    a plurality of conductive power rail structures disposed above said plurality of conductive metal wires of the PDN and separated therefrom by an etch stop dielectric material layer, the etch stop layer situated on top of the conductive metal wire of said power delivery network and below the conductive power rail structure; and
    a conductive via structure electrically connecting a conductive power rail structure to a conductive metal wire of the PDN, said conductive via structure passing through said etch stop dielectric material layer, wherein the conductive via structure electrically connecting a conductive power rail structure is self-aligned to said conductive power rail structure.

2. The semiconductor structure as claimed in claim 1, wherein a bottom surface of each said conductive power rail structure is aligned to said etch stop dielectric material layer.

3. The semiconductor structure as claimed in claim 1, wherein each said conductive power rail structure and conductive via have a common metallization.

4. The semiconductor structure of claim 1, wherein an aspect ratio of a height dimension:width dimension of said conductive power rail structure is greater than 4:1.

5. The semiconductor structure of claim 1, wherein a height dimension of said conductive power rail structure is greater than three times a height dimension of said conductive via structure.

6. The semiconductor structure of claim 1, wherein a length dimension of said conductive via structure is greater than a height dimension of said conductive power rail structure.

7. The semiconductor structure of claim 1, wherein a length dimension of said conductive via structure is greater than about 50% of a width of a conductive metal wire.

8. The semiconductor structure of claim 1, wherein a length dimension of said conductive via structure is greater than about 3:1 of a width of said conductive via structure.

9. The semiconductor structure of claim 1, wherein each of the plurality of said conductive metal wires disposed within said first insulating material layer is separated by a space, a ratio of a width dimension of a conductive metal wire to a spacing width between adjacent conductive metal wires is greater than about 1.5:1.

10. The semiconductor structure of claim 1, further comprising:
    a second insulating material layer formed atop said etch stop dielectric material layer; and
    a semiconductor structure bonded to a surface of said second dielectric material layer, said semiconductor structure including a semiconductor region within which are formed transistor device structures.

* * * * *